United States Patent [19]
Kolluri

[11] Patent Number: 5,742,154
[45] Date of Patent: Apr. 21, 1998

[54] MULTI-STAGE CURRENT FEEDBACK AMPLIFIER

[75] Inventor: Madhav V. Kolluri, Sunnyvale, Calif.

[73] Assignee: Maxim Integrated Products, Sunnyvale, Calif.

[21] Appl. No.: 497,323

[22] Filed: Jun. 30, 1995

[51] Int. Cl.⁶ .............................. G05F 3/16; G05F 3/20; G05F 3/30
[52] U.S. Cl. ........................... 323/313; 323/315; 323/316
[58] Field of Search ........................ 323/313, 314, 323/315, 316; 327/538, 539, 540, 542; 330/257, 288

[56] References Cited

U.S. PATENT DOCUMENTS

| | | | |
|---|---|---|---|
| 4,085,359 | 4/1978 | Ahmed | 323/22 T |
| 4,380,740 | 4/1983 | Kaplan | 323/316 |
| 4,485,352 | 11/1984 | Davies et al. | 330/288 |
| 4,591,804 | 5/1986 | Van Tuijl | 323/316 |
| 5,029,295 | 7/1991 | Bennett et al. | 323/313 |
| 5,168,210 | 12/1992 | Thus | 323/313 |
| 5,430,395 | 7/1995 | Ichimaru | 327/312 |

OTHER PUBLICATIONS

"Current Feedback Amplifier," Analog Devices AD8011, believed to be before Jun. 30, 1995, pp. 1–16.

Primary Examiner—Peter S. Wong
Assistant Examiner—Bao Q. Vu
Attorney, Agent, or Firm—Hickman Beyer & Weaver

[57] ABSTRACT

A multi-stage current feedback amplifier having a first stage and a second stage. The multi-stage amplifier comprises a transistor device having a base, an emitter, and a collector, as well as a replicating device having a base, an emitter, and a collector. The base of the replicating device is coupled to the base of the transistor device, wherein a voltage in the emitter of the transistor device is substantially replicated in the emitter of the replicating device. Further, the inventive multi-stage feedback amplifier comprises a current mirror circuit having a current mirror circuit input and a current mirror circuit output, which current mirror circuit input is coupled to the collector of the replicating device. The current mirror circuit output is coupled to the collector of the transistor device. Additionally, there is provided a second stage device having a base, an emitter, and a collector, the base of the second stage device being coupled to the current mirror circuit output, wherein a base drive current to the second stage device comprises the difference between a current in the current mirror circuit output and a collector current in the collector of the second mirror device.

25 Claims, 3 Drawing Sheets

MULTI-STAGE CURRENT FEEDBACK AMPLIFIER

BACKGROUND OF THE INVENTION

The present invention relates to current feedback amplifiers. In particular, the invention relates to an improved method and apparatus for achieving higher gain by implementing a multistage current feedback amplifier.

Amplifiers are known in the art. In modern digital and analog circuits, amplifiers represent an indispensable building block. In general amplifiers are designed and manufactured as general purpose "uncommitted" gain devices. In other words, they are supplied to end users as open loop blocks without commitment to any particular closed-loop gain setting. By appropriately choosing the external gain setting devices, the user may set the closed loop characteristics of the amplifier to fit a particular application.

Current feedback amplifiers (herein CF amplifiers) are particularly preferred for their ability to provide wide bandwidth at different gain settings and for their superior ability (relative to voltage feedback amplifiers) to slew signals having large amplitudes. It is also well known, however, that current feedback amplifiers have lower open loop gain than voltage feedback amplifiers. A typical voltage feedback amplifier may have an open loop gain in the millions whereas a typical current feedback amplifier may have an open loop gain in the thousands. This limitation is due to the fact that typical CF amplifiers employ a single gain stage.

Figure 1:
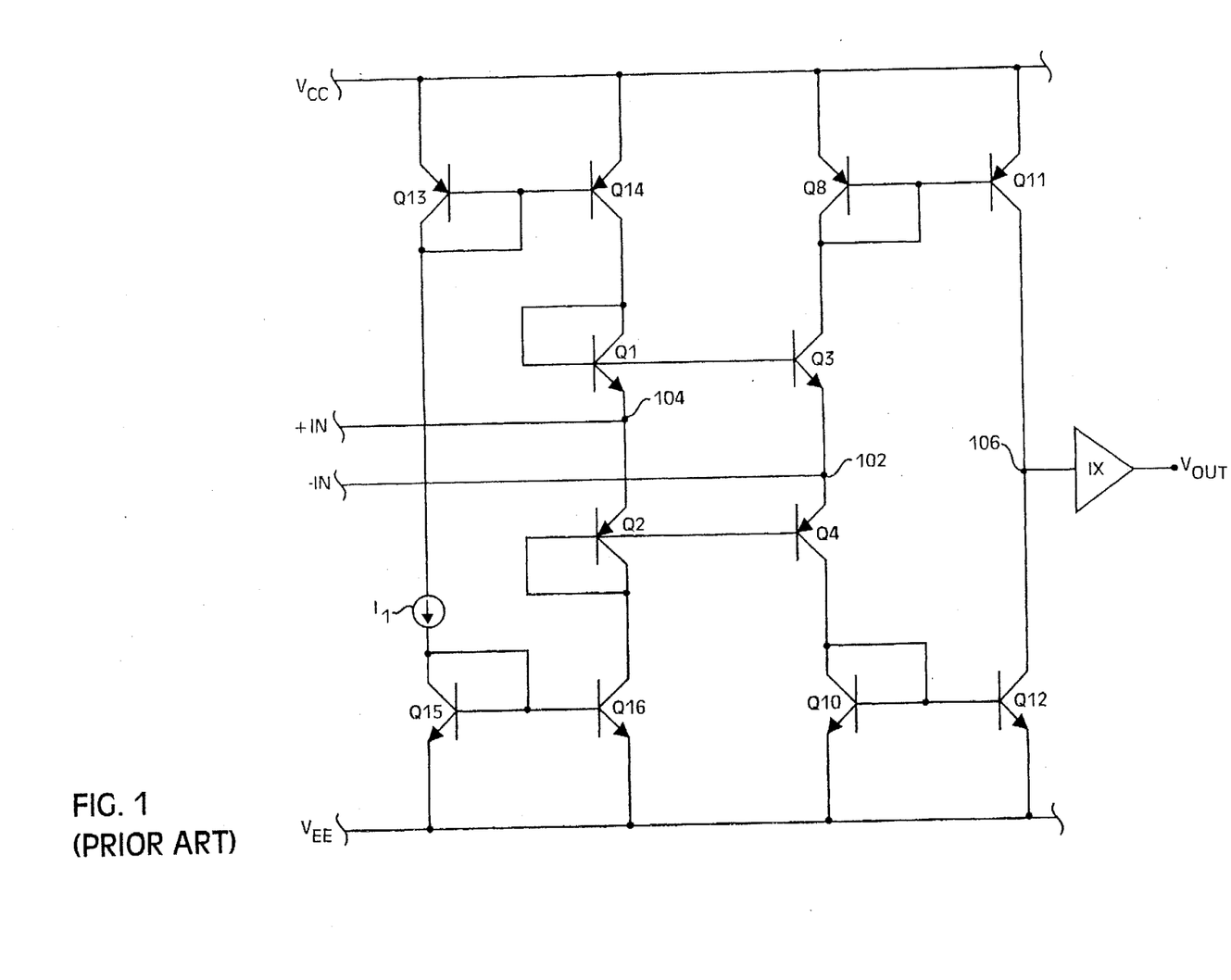
FIG. 1 is a circuit diagram illustrating a representative conventional single stage CF amplifier.

FIG. 1 is a circuit diagram illustrating a representative conventional single stage CF amplifier. The operation and characteristics of conventional single-stage current feedback amplifiers, similar to that shown in FIG. 1, have been described extensively in existing literature and are not discussed in details herein for brevity sake. For further background information regarding single stage CF amplifiers, reference may be made to, for example, Jim Williams, ed., *Analog Circuit Design: Art, Science and Personalities*, (Butterworth-Heinemann, 1991); Comlinear Corporation, 1989 *Databook: Solutions with Speed* (Comlinear, 1989); Analog Devices, *Amplifier Reference Manual* (Analog Devices, 1992), all of which are incorporated herein by reference for all purposes.

A typical technique for achieving high gain in voltage feedback amplifiers involves coupling multiple gain stages together. The gain of the resulting amplifier is approximately the product of the gains of the individual gain stages. For current feedback amplifiers, however, the aforementioned approach of merely coupling gain stages together to increase amplifier gain is not a viable approach due to the difficulty in controlling the quiescent current of the second stage. The variability of the second stage current can lead to poor control of certain amplifier characteristics, such as supply current, bandwidth, gain peaking, offset voltages, and the like.

Consequently, an improved method and apparatus for coupling multiple gain stages together in a current feedback amplifier to increase the open loop amplifier gain is desired. It is also desired that the resultant amplifier has a low offset and its quiescent current be as free of process variations as possible.

SUMMARY OF THE INVENTION

The present invention relates to an improved method and apparatus for achieving higher gain in a current feedback (CF) amplifier by implementing a multi-stage CF amplifier. In the inventive multi-stage CF amplifier, the second stage is controlled to be independent of process variations in an open loop manner without requiring any feedback control based on the collector current of the second stage transistor.

In one embodiment, the invention relates to a multi-stage current feedback amplifier having a first stage and a second stage. The multi-stage amplifier comprises a transistor device having a base, an emitter, and a collector. The inventive multi-stage feedback amplifier further comprises a replicating device having a base, an emitter, and a collector. The base of the replicating device is coupled to the base of the transistor device, wherein a voltage in the emitter of the transistor device is substantially replicated in the emitter of the replicating device.

Further, the inventive multi-stage feedback amplifier comprises a current mirror circuit having a current mirror circuit input and a current mirror circuit output, which current mirror circuit input is coupled to the collector of the replicating device. The current mirror circuit output is coupled to the collector of the transistor device.

Additionally, the inventive multi-stage feedback amplifier comprises a second stage device having a base, an emitter, and a collector, the base of the second stage device being coupled to the current mirror circuit output, wherein a base drive current to the second stage device comprises the difference between a current in the current mirror circuit output and a collector current in the collector of the second mirror device.

In another embodiment, the base drive current to the second stage device substantially equals the difference between a current in the current mirror circuit output and a collector current in the collector of the second mirror device.

BRIEF DESCRIPTION OF THE DRAWINGS

Additional advantages of the invention will become apparent upon reading the following detailed description and upon reference to the drawings, in which.

DETAILED DESCRIPTION OF THE INVENTION

In the analysis that follows, higher order effects such as output impedance effects, mismatch, and the like, are ignored. Further, it is assumed that the value of $\beta_N$ and $\beta_P$ are substantially greater than 1 (but not necessarily equal to each other). $\beta_N$ is the forward current gain of NPN transistors, and $\beta_P$ is the forward current gain of PNP transistors. Throughout this disclosure, the following mathematical approximation is applied where appropriate.

$$1/(1+X) \approx 1-X$$

wherein X is an arbitrary variable that is substantially less than 1.

Figure 2:
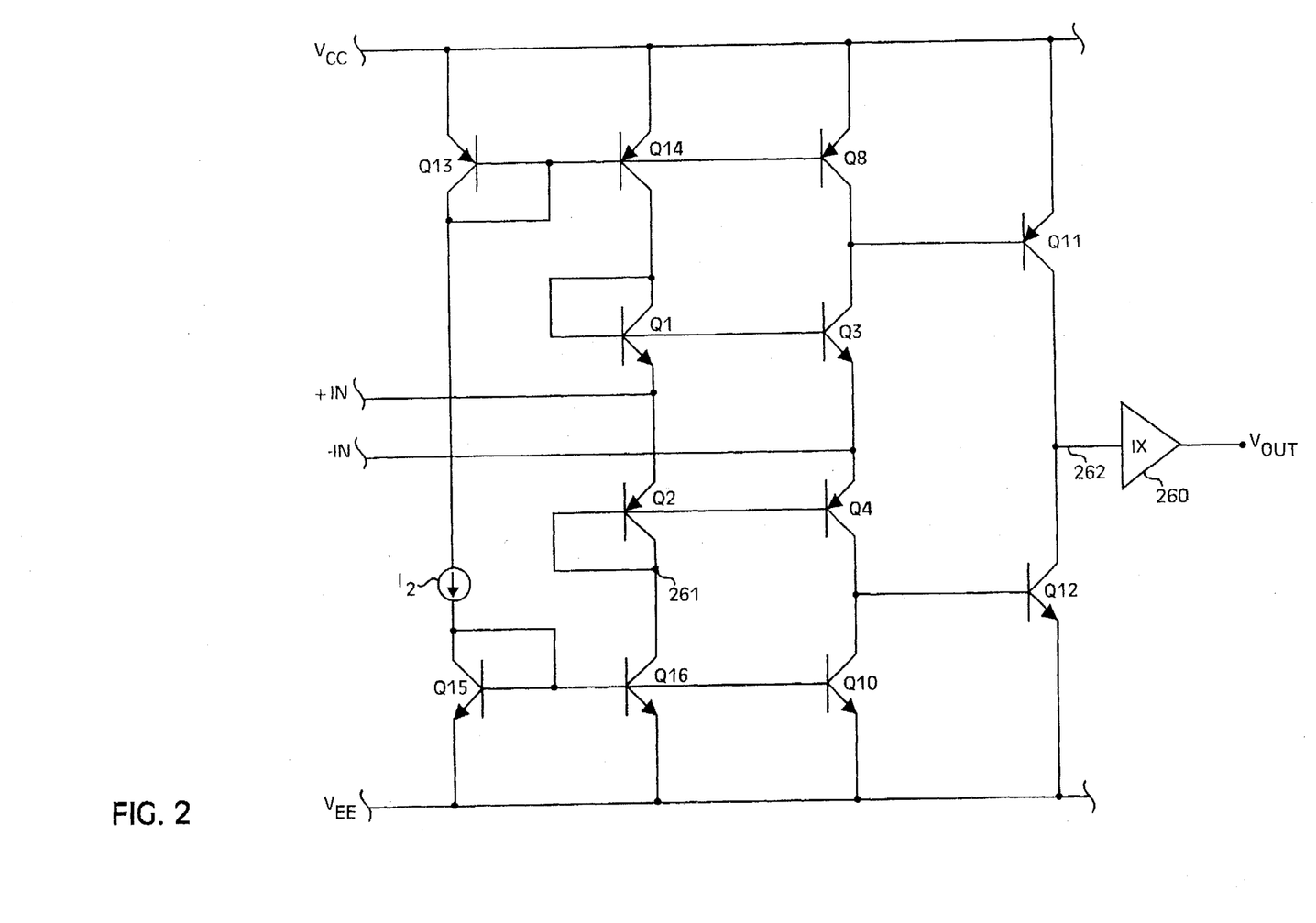
FIG. 2 is a circuit diagram of a simple multi-stage current feedback (CF) amplifier.

FIG. 2 is a circuit diagram of a simple multi-stage current feedback (CF) amplifier. In the multi-stage CF amplifier of FIG. 2, a common emitter second stage, which comprises transistors Q11 and Q12, are coupled to a current feedback amplifier first stage. Analysis of this simple circuit illustrates the problems associated with designing a multi-stage CF amplifier. As seen in FIG. 2, the amplifier output current, i.e., the current outputted by the common-emitter second stage and inputted into a buffer 260 along conductor 262, comprises the difference between the collector currents of transistors Q11 and Q12.

To facilitate discussion of the response of the amplifier output current in conductor 262, it is helpful to consider separately the responses of its constituent currents, i.e., each of the collector currents of transistors Q11 and Q12. Transistors Q1 and Q3 are substantially identical, so are transistors Q2 and Q4. The bases of transistors Q1 and Q3 and the bases of transistors Q2 and Q4 are tied together. The emitter of transistor Q1 is tied to the emitter of transistor Q2, and the emitter of transistor Q3 is tied to the emitter of transistor Q4. The collector current of transistor Q4 is therefore substantially equal to the collector current of transistor Q2, and the collector current of transistor Q3 is substantially equal to the collector current of transistor Q1.

$$I_CQ1=I_CQ3 \quad (1)$$

$$I_CQ2=I_CQ4 \quad (2)$$

The bases of transistors Q15, Q16, and Q10, which are substantially identical devices, are coupled together. Ignoring higher order effects such as output impedance effects, mismatch, and the like, the collector current of transistor Q15 ($I_CQ15$) is therefore represented by the following equation.

$$I_CQ15+3I_BQ15=I_2 \quad (3)$$

where $I_BQ15$ represents the base current of transistor Q15 and $I_2$ represents the current supplied by the current source $I_2$ for biasing the amplifier. It should be noted that $I_BQ15 \approx I_BQ16 \approx I_BQ10$, wherein $I_BQ16$ and $I_BQ10$ represent the base currents of transistors Q16 and Q10 respectively.

Further, since $I_BQ15=I_CQ15/\beta_N$, eq. (3) becomes $$I_CQ15+3(I_CQ15/\beta_N)=I_2 \quad (4)$$

or $$I_CQ15=I_2((1)/(1+3/\beta_N) \quad (5)$$

Since $\beta_N$ is typically much greater than 1, the value of $3/\beta_N$ is therefore small, and eq. (5) can be approximated to be $$I_CQ15=I_2-3I_2/\beta_N \quad (6)$$

Since transistors Q10, Q15, and Q16 are substantially identical $$I_CQ10=I_CQ16=I_CQ15=I_2-3I_2/\beta_N \quad (7)$$

Applying Kirchoff's Current Law (KCL) at node 261 of FIG. 2 yields $$I_CQ2+I_BQ2+I_BQ4=I_CQ16 \quad (8)$$

Since $I_CQ2 \approx I_CQ4$ and $I_BQ2 \approx I_BQ4$ $$I_CQ4+I_BQ4+I_BQ4=I_CQ4+2I_BQ4 = I_CQ4+2I_CQ4/\beta_P=I_CQ4 * (1+2/\beta_P) \quad (9)$$

Therefore $I_CQ4=I_CQ16/(1+2/\beta_P) \quad (10)$ i.e., $I_CQ4=I_2(1-3/\beta_N)*(1-2/\beta_P) \quad (11)$ The difference between the collector currents of transistors Q4 and Q10 represents the base drive current for transistor Q12 ($I_BQ12$). As is typically the case, $I_CQ10$ is scaled down by a factor M in order to ensure that there is an adequate base drive current into transistor Q12.

Consequently, the base drive current into transistor Q12 ($I_BQ12$) may be represented from eqs. (7) and (11) by:

$$I_BQ12=I_CQ4-I_CQ10 * M =[I_2(1-3/\beta_N)*(1-2/\beta_P)]-(I_2-3I_2/\beta_N) * M \quad (12)$$

The collector current of transistor Q12 ($I_CQ12$) is then $$I_CQ12=\beta_N * I_BQ12 =\beta_N * [[I_2(1-3/\beta_N)*(1-2/\beta_P)]-(I_2-3I_2/\beta_N) * M] \quad (13)$$

The collector current of $I_CQ12$ is a direct function of $\beta_N$, which is a process dependent variable and therefore $I_CQ12$ could experience significant variation.

By identical analysis, the collector current of transistor Q11 may be shown to be $$I_CQ11=\beta_P * [[I_2(1-3/\beta_P)*(1-2/\beta_N)]-(I_2-3I_2/\beta_P) * N] \quad (14)$$

where N is another multiplying factor for scaling the emitter area of transistor Q8 to provide an adequate base drive current for transistor $Q_{11}$.

The collector current of $I_CQ11$ is a direct function of $\beta_P$, which is a process dependent variable and therefore IQ11 could experience significant variation.

Transistors Q11 and Q12 form the second gain stage of the amplifier. The collector currents of transistors Q11 ($I_CQ12$) and Q12 ($I_CQ12$) are poorly controlled due to their direct dependence on $\beta_N$ and $\beta_P$ as can be seen in the foregoing analysis. In addition, the values of $\beta_N$ and $\beta_P$ are uncorrelated in a typical process. The collector currents of transistors Q11 and Q12 could therefore experience significant mismatches. The mismatch between the collector currents of transistors Q11 and Q12 can exacerbate offset voltage problems and complicate frequency compensation of the amplifier.

Collector-to-emitter voltages ($V_{CE}$) of current source transistors Q16 and Q10 (likewise of Q14 and Q8) do not track each others with variations in input signals and/or supply voltages. Similarly, collector-to-emitter voltages of current source transistors Q2 and Q4 (likewise of Q1 and Q3) do not track each others with variations in input signals and/or supply voltages. High frequency processes are usually characterized by low output impedance, $R_{out}$ ($R_{out}=\Delta V_{CE}/\Delta I_C$), where $I_C$ represents the collector current. The differences in the collector-to-emitter voltages of the aforementioned transistor pairs therefore cause a further degradation in the matching of the respective collector currents. Therefore, in addition to the variations due to $\beta_P$ and $\beta_N$, there is further uncertainty in the second stage current caused by the output impedance effects of the transistors due to the mismatch in their collector-emitter voltages. As mentioned previously, the variability of the second stage current can lead to poor control of certain amplifier characteristics, such as supply current, bandwidth, gain peaking, offset voltages, and the like.

Furthermore, the collector current of transistor Q11 ($I_CQ11$) and the collector current of transistor Q12 ($I_CQ12$) may be out of balance, resulting in an increase in input referred offset voltage.

The foregoing analysis and discussion of the circuit of FIG. 2 highlight the reason why a simple approach to implementing a multi-stage CF amplifier by merely coupling multiple gain stages together is not viable.

Figure 3:
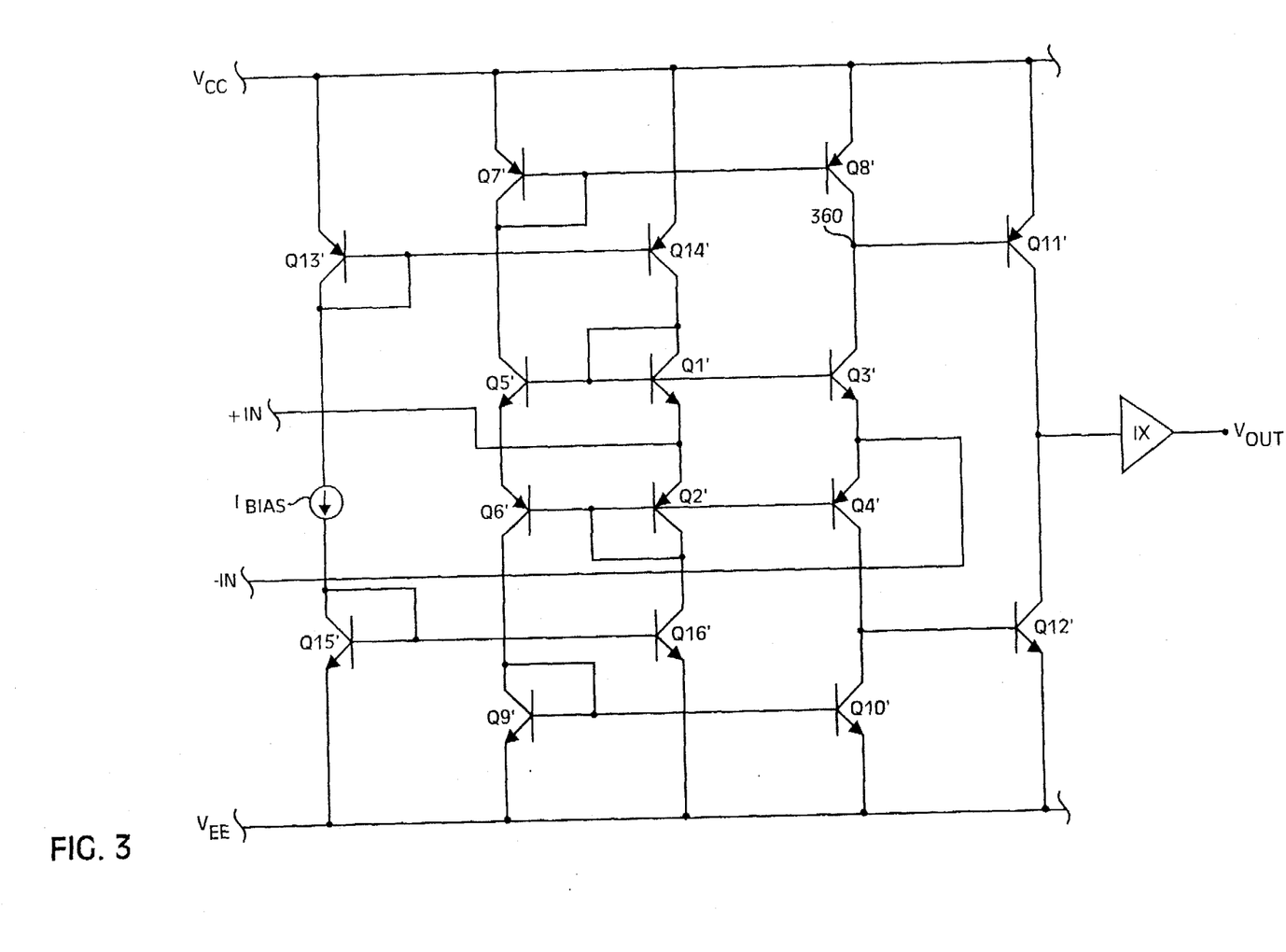
FIG. 3 is a circuit diagram illustrating a new topology for a two-stage current feedback amplifier in accordance with one aspect of the present invention.

FIG. 3 is a circuit diagram illustrating a new topology for a two-stage current feedback amplifier in accordance with one aspect of the present invention. The circuit of FIG. 3 addresses the problems associated with the aforementioned circuit of FIG. 2. In particular, the second stage current can be controlled to be close to a target value independent of process variations. Further, the input offset voltage of the multi-stage amplifier of FIG. 3 is almost the same as that of a single stage amplifier. In discussing FIG. 3, it should be kept in mind that the devices of FIG. 3 having primed numeral designations have substantially similar function to corresponding devices in FIG. 2 having unprimed numeral designations.

In contrast with the two-stage CF amplifier of FIG. 2, the second stage current of the CF amplifier of FIG. 3 is relatively immune to changes in the values of process-dependent parameters $\beta_N$ and $\beta_P$ and transistor output impedance. As will be shown, the second stage current is dependent only on the bias current source $I_{BIAS}$ of FIG. 3 and the emitter area scaling of the transistors of the amplifier.

This invention utilizes an open loop approach to achieving predictable current in the second stage as opposed to a closed loop approach. In a closed loop topology, the second stage current is sampled and compared to a desired target value and controlled accordingly. A primary advantage of the open loop topology is that the frequency stability concern, which is inherent in feedback circuits, is not an issue. This potentially allows for the design of a multi-stage CF amplifier having higher bandwidth.

Referring now to FIG. 3, there are shown additional transistors Q5', Q6', Q7', and Q9', which are used to establish the bias current of transistors Q8' and Q10'. This is unlike the circuit of FIG. 2 where the bias current of transistors Q8 and Q10 are derived from transistors Q13 and Q15. Transistors Q5' and Q6' of FIG. 3 are replica devices, which are substantially identical to transistors Q3' and Q4' respectively. Their collector currents, therefore, are substantially similar to those of transistors Q3' and Q4' respectively. The collector current of transistor Q5' flows through diode-connected transistor Q7', setting up the bias current in transistor Q8'. Similarly, the collector current of transistor Q6' flows through diode-connected transistor Q9', setting up the bias current in transistor Q10'.

$I_{BIAS}$ sets up the operating of the amplifier and can be chosen to achieve the desired characteristics of a specific amplifier design such as the bandwidth, drive capabilities, or the like. The current $I_{BIAS}$ is mirrored by transistors Q13' and Q14' and transistors Q15' and Q16' to supply operating current to input transistors Q1' and Q2' respectively.

The collector current of transistors Q3' and Q4' are substantially replicated in replica transistors Q5' and Q6' respectively. Note that replica transistor Q5', which is substantially identical to transistor Q3' in size and type, has its base coupled to the base of transistor Q3'. A similar arrangement exists with respect to replica transistor Q6' and transistor Q4'. Further, replica transistors Q5' and Q6' have their emitters coupled in like manner to that of transistors Q3' and Q4'. With the transistor Q3' and Q4', Q5' and Q6' connected in this manner, the voltage at the emitters of Q3' (and Q4') are substantially equal to the voltage at the emitters of Q5' (and Q6').

Transistors Q7' and Q8' form one implementation of a current mirror circuit. The collector current flowing through replica transistor Q5' flows through diode-connected mirror transistor Q7', which is then mirrored in mirror transistor Q8' with a certain amount of base current lost. It should be appreciated that the same process also occurs in replica transistor Q6', diode-connected mirror transistor Q9', and mirror transistor Q10' respectively.

Mirror transistors Q7', Q8', and second stage transistor Q11' are of the same type, e.g., all are PNP transistors. Similar arrangement exists with respect to mirror transistors Q9', Q10', and second stage transistor Q12' as shown in FIG. 3. The amount of base current lost between the mirror transistors, e.g., between transistor pairs Q7'/Q8' or transistor pairs Q9'/Q10' substantially equals the amount of base current drive to the second stage transistors, e.g., transistor Q11' and transistor Q12' respectively. The base drive current of second stage transistor Q11' is substantially equal to the difference in the collector currents of mirror transistor Q8' and transistor Q3'. Likewise, the base drive current of second stage transistor Q12' is substantially equal to the difference in the collector currents of mirror transistor Q10' and transistor Q4'.

The base drive currents to transistors Q11' and Q12', which comprise the second stage of the multi-stage CF amplifier, are therefore driven by the base current derived from transistors of the same type (PNP or NPN, respectively) operating at collector currents set by $I_{BIAS}$, which can be well controlled. The collector currents of the second stage transistors Q11' and Q12' are therefore well controlled. The collector-emitter voltages of Q3' and Q5' (and likewise of Q4' and Q6') are substantially identical even with variations in input signals and/or supply voltages. The collector-emitter voltages of Q7' and Q8' (and likewise of Q9' and Q10') are also substantially identical. Transistor output impedance therefore does not substantially impact the second stage current. Transistors Q5', Q7', and Q8' may be viewed as an open loop base driver circuit which, in conjunction with transistor Q3', provides a base drive current to establish a quiescent collector current in second-stage transistor Q11' in a manner that is substantially free of process variations, such as variations in $\beta_P$, $\beta_N$, and output impedance Likewise, transistors Q6', Q9', and Q10' make up a open loop base driver circuit which, in conjunction with transistor device Q4', provides a base drive current to establish a quiescent collector current in second-stage transistor Q12' in a manner that is also substantially free of process variations.

A more rigorous qualitative analysis of the inventive multi-stage CF amplifier of FIG. 3 are disclosed and is made in reference to the circuit diagram of FIG. 3. In the discussion pertaining to FIG. 3 that follows, the assumptions stated in connection with the circuit of FIG. 2 are still applicable.

Analogous to the analysis of the collector current of transistor Q15 of FIG. 2, via, e.g., eq. (6), the collector current of transistor Q15' of FIG. 3 is $$I_C Q15' = I_{BIAS} - 2\, I_{BIAS}/\beta_P \tag{15}$$

Analogous to the analysis of the collector current of transistor Q4 of FIG. 2, via, e.g., eq. (11), the collector current of transistor Q4' of FIG. 3 is $$I_C Q4' = I_C Q16'/(1+3/\beta_P) \tag{16}$$

$$\text{i.e., } I_C Q4' = I_{BIAS}(1-2/\beta_N)*(1-3/\beta_P) \tag{17}$$

The collector current of transistor Q6' flows through diode-connected transistor Q9' and is mirrored by transistor Q10'.

Therefore, $$I_C Q6' = I_C Q9' + I_B Q9' + I_B Q10' \tag{18}$$

Since transistors Q9' and Q10' are substantially identical, their collector currents are substantially equal, as are their base currents.

i.e., $I_CQ6'=I_CQ10'+I_BQ10'+I_BQ10'$     (19)

i.e., $I_CQ6'=I_CQ10'+I_CQ10'/\beta_N+I_CQ10'/\beta_N$     (20)

i.e., $I_CQ6'=I_CQ10'*(1+2/\beta_N)$     (21)

i.e., $I_CQ10'=I_CQ6'/(1+2/\beta_N)=I_CQ6'*(1-2/\beta_N)$     (22)

Since $I_CQ6' \approx I_CQ4'$ $$I_CQ10'=I_CQ4'*(1-2/\beta_N) \quad (23)$$

Therefore, the base drive of transistor Q12' is the difference in the collector currents of transistors Q4' and Q10'.

$$I_BQ12'=I_CQ4'-I_CQ10' \quad (24)$$

i.e., $I_BQ12'=I_CQ4'-I_CQ4'*(1-2/\beta_N)$     (25)

i.e., $I_BQ12'=I_CQ4'*2/\beta_N$     (26)

Therefore $$I_CQ12'=I_CQ4'*2 \quad (27)$$

According to eq. (17), $I_CQ4'=I_{BIAS}(1-2/\beta_N)*(1-3/\beta_P)$, therefore $$I_CQ12'=2*[I_{BIAS}(1-2/\beta_N)*(1-3/\beta_P)] \quad (28)$$

which is approximately $$I_CQ12'=2*I_{BIAS} \quad (29)$$

since $\beta_N$ and $\beta_P$ are substantially greater than 1.

The process dependent parameters $\beta_P$ and $\beta_N$ have very little effect on the collector current of transistor Q12' ($I_CQ12'$). This is unlike the situation in the circuit of FIG. 2 where the collector current of transistor Q12 ($I_CQ12$) is a direct function of $\beta_N$.

By identical analysis, the collector current of transistor Q11', which represents one of the two transistor devices of the second stage, can be shown to be $$I_CQ11'=2*[I_{BIAS}(1-2/\beta_P)*(1-3/\beta_N)] \quad (30)$$

which is approximately $$I_CQ11'=2*I_{BIAS} \quad (31)$$

The process dependent parameters $\beta_P$ and $\beta_N$ have very little effect on the collector current of transistor Q11' ($I_CQ11'$). This is unlike the situation in the circuit of FIG. 2 where the collector current of transistor Q11 ($I_CQ11$) is a direct function of $\beta_P$.

Thus, from the foregoing analysis, it can be seen that the collector current of transistors Q11' ($I_CQ11'$) and Q12' ($I_CQ12'$) are now relatively immune to the process dependent parameters $\beta_P$ and $\beta_N$. It should be apparent that the output current of the second stage of the multi-stage CF amplifier of FIG. 3 depends primarily on the amplitude of the bias current source $I_{BIAS}$ and not on $\beta_P$ and $\beta_N$.

As an additional advantage, it should be noted that the collector current of transistor Q11' ($I_CQ11'$) and the collector current of transistor Q12' ($I_CQ12'$) differs by only a small factor, i.e., $(1-1/\beta_N)$ versus $(1-1/\beta_P)$. For typical $\beta_P$ and $\beta_N$, the offset between these two collector current values are relatively small, resulting in an amplifier offset voltage that is close to the ideal zero value.

In the embodiment of FIG. 3, the collector voltages of transistors Q3' and Q5' (and likewise of Q4' and Q6') are substantially identical, independent of input voltages and/or supply voltage variations. Also, the collector-emitter voltages of Q7' and Q8' (likewise of Q9' and Q10') are substantially identical, independent of input voltages and/or supply voltage variations. The collector currents of Q11' and Q12' are therefore independent of transistor output impedance.

Note that the present invention advantageously utilizes a novel open loop scheme to facilitate the implementation of a multi-stage CF amplifier to achieve higher gain. This is different from schemes which may utilize close-loop topologies, e.g., those utilizing feedback circuitries that sense the second stage current to control the bias circuit. The use of an open loop topology advantageously simplifies the frequency compensation of the resulting amplifier and offers potential for higher bandwidth. Further, the addition of a second gain stage using the present inventive technique does not detrimentally affect the input offset voltage of the single-stage CF amplifier.

The present inventive topology facilitates higher gain in current feedback amplifiers by permitting multiple gain stages to be coupled together. As a consequence of the improved amplifier gain, amplification may be achieved at higher accuracy and less distortion than was possible in the prior art.

Although only a few embodiments of the present invention have been described in detail, it should be understood that the present invention may be embodied in many other specific forms without departing from the spirit or scope of the invention. For example, the invention has been discussed in detail based on an assumption that the current source transistors, e.g., Q7', Q8', Q9', and Q10', are reasonably well matched. In some amplifier circuits, it is contemplated that small amounts of emitter degeneration may be introduced, using, for example, small degeneration resistors coupled in series with the emitters of selected ones of the aforementioned current source transistors, to improve matching, thus minimizing the variability of the second stage current.

Further improvement in the matching of the input stage transistors Q3', Q4', Q5', and Q6' may be achieved by using multiple devices for each and laying them out in a balanced manner so as to reduce transistor mismatch. It is also contemplated that the scaling of the transistor of the amplifier may be individually adjusted to obtain a desired set of amplifier characteristics.

As a further example, transistors Q7' and Q9' may not necessarily be diode-connected in the manner shown in FIG. 3. Other current mirror arrangements may be used to replace Q7' and Q8' (and likewise Q9' and Q10'). Alternative arrangements may also be provided to change the base drive of the second stage by injecting a current into the base of the second stage transistor, e.g., into node 360 or node 370 of FIG. 3. Alternatively, arrangements other than the exact one shown in FIG. 3 for the input transistors Q1', Q2', Q3', and Q4' may be employed. One such arrangement may be found in the aforementioned Williams reference. Furthermore, it is not necessary that input transistors Q1' and Q2' must be biased by respective transistors Q14' and Q16'. They may instead be biased using any other number of commonly known techniques.

Additionally, although FIG. 3 shows explicitly only a two-stage CF amplifier, the present inventive technique may be applied to create a multi-stage CF amplifier having any number of stages, e.g., 3, 4, 5, or more. Such substitutions and variations on the inventive concepts are possible and are within the skills of one skilled in the art given this disclosure. Furthermore, it is contemplated that the residual errors in the collector currents of the second stage transistors Q11' and Q12' may be reduced by conventional techniques known to those of skills in the art. In view of the foregoing, it should be apparent that the present examples are to be considered as illustrative and not restrictive, and the invention is not to be limited to the details given herein, but may be modified within the scope of the appended claims.

What is claimed is:

1. In a multi-stage current feedback amplifier having a first stage and a second stage, a method for controlling a quiescent current of said second stage, comprising the steps of:

providing a transistor device having a base, an emitter, and a collector, the emitter receiving an input signal to be amplified;

providing a replicating device having a base, an emitter, and a collector, said base of said replicating device being coupled to said base of said transistor device, wherein a voltage in said emitter of said transistor device is substantially replicated in said emitter of said replicating device;

providing a current mirror circuit having a current mirror circuit input and a current mirror circuit output, said current mirror circuit input being coupled to said collector of said replicating device, said current mirror circuit output being coupled to said collector of said transistor device; and providing a second stage device having a base, an emitter, and a collector, said base of said second stage device being coupled to said current mirror circuit output, wherein a base drive current to said second stage device substantially comprises the difference between a current in said current mirror circuit output and a collector current in said collector of said second mirror device, wherein said base drive current is generated in an open loop manner without requiring feedback control based on said collector current of said second stage device.

2. The method of claim 1 wherein said step of providing a current mirror circuit comprises the steps of:

providing a first mirror device having a base, an emitter, and a collector, said collector of said first mirror device representing said current mirror circuit input; and providing a second mirror device having a base, an emitter, and a collector, said collector of said second mirror device representing said current mirror circuit output, said base of said second mirror device being coupled to said base of said first mirror device, wherein a collector current through said collector of said first mirror device is at least partially mirrored in said collector of said second mirror device.

3. The method of claim 1 wherein said base drive current of said second stage device substantially equals said difference between said current in said current mirror circuit output and said collector current in said collector of said transistor device.

4. The method of claim 3 wherein said step of providing a current mirror circuit comprises the steps of:

providing a first mirror device having a base, an emitter, and a collector, said collector of said first mirror device representing said current mirror circuit input; and providing a second mirror device having a base, an emitter, and a collector, said collector of said second mirror device representing said current mirror circuit output, said base of said second mirror device being coupled to said base of said first mirror device, wherein a collector current through said collector of said first mirror device is at least partially mirrored in said collector of said second mirror device.

5. The method of claim 4 wherein said base of said first mirror device is coupled to said collector of said first mirror device.

6. The method of claim 5 wherein said base drive current substantially equals base current lost between said first mirror device and said second mirror device.

7. The method of claim 5 wherein said first mirror device, said second mirror device, and said second stage device are of the same device type.

8. The method of claim 7 said device type is PNP transistor.

9. The method of claim 8 wherein said emitter of said first mirror device, said emitter of said second mirror device, and said emitter of said second stage device are all operatively connected to a supply voltage level $V_{CC}$.

10. The method of claim 7 wherein said device type is NPN transistor.

11. The method of claim 10 wherein said emitter of said first mirror device, said emitter of said second mirror device, and said emitter of said second stage device are all operatively connected to a supply voltage level $V_{EE}$.

12. A multi-stage current feedback amplifier having a first stage and a second stage, comprising:

a transistor device having a base, an emitter, and a collector, the emitter receiving an input signal to be amplified;

a replicating device having a base, an emitter, and a collector, said base of said replicating device being coupled to said base of said transistor device, wherein a voltage in said emitter of said transistor device is substantially replicated in said emitter of said replicating device;

a current mirror circuit having a current mirror circuit input and a current mirror circuit output, said current mirror circuit input being coupled to said collector of said replicating device, said current mirror circuit output being coupled to said collector of said transistor device; and a second stage device having a base, an emitter, and a collector, said base of said second stage device being coupled to said current mirror circuit output, wherein a base drive current to said second stage device comprises the difference between a current in said current mirror circuit output and a collector current in said collector of said transistor device, wherein the base drive current results in a current in said collector of said second stage device that is substantially immune to changes in a forward current gain of any device in the first and second stages of said multi-stage feedback amplifier.

13. The amplifier of claim 12 wherein said current mirror circuit comprises:

a first mirror device having a base, an emitter, and a collector, said collector of said first mirror device representing said current mirror circuit input; and a second mirror device having a base, an emitter, and a collector, said collector of said second mirror device representing said current mirror circuit output, said base of said second mirror device being coupled to said base of said first mirror device, wherein a collector current through said collector of said first mirror device is at least partially mirrored in said collector of said second mirror device.

14. The amplifier of claim 12 wherein said base drive current of said second stage device substantially equals said difference between said current in said current mirror circuit output and said collector current in said collector of said transistor device.

15. The amplifier of claim 14 wherein said current mirror circuit comprises:

a first mirror device having a base, an emitter, and a collector, said collector of said first mirror device representing said current mirror circuit input; and a second mirror device having a base, an emitter, and a collector, said collector of said second mirror device representing said current mirror circuit output, said base of said second mirror device being coupled to said base of said first mirror device, wherein a collector current through said collector of said first mirror device is at least partially mirrored in said collector of said second mirror device.

16. The amplifier of claim 15 wherein said base of said first mirror device is coupled to said collector of said first mirror device.

17. The amplifier of claim 16 wherein said base drive current substantially equals base current lost between said first mirror device and said second mirror device, and wherein said base drive current is generated in an open loop manner without requiring feedback control based on said collector current of said second stage device.

18. The amplifier of claim 16 wherein said first mirror device, said second mirror device, and said second stage device are of the same device type.

19. The amplifier of claim 18 wherein said device type is PNP transistor.

20. The amplifier of claim 19 further comprising a conductor having a supply voltage level $V_{CC}$, said conductor being coupled to said emitter of said first mirror device, said emitter of said second mirror device, and said emitter of said second stage device.

21. The amplifier of claim 18 wherein said device type is NPN transistor.

22. The amplifier of claim 21 wherein said emitter of said first mirror device, said emitter of said second mirror device, and said emitter of said second stage device are all operatively connected to a supply voltage level $V_{EE}$.

23. A multi-stage current feedback amplifier comprising:

a transistor device having a base, an emitter, and a collector;

a second stage device having a base, an emitter, and a collector, said base of said second stage device being coupled to said collector of said transistor device; and means, coupled to said base of said transistor device and said base of said second stage device, for providing, in conjunction with said transistor device, a base drive current to said base of said second stage device such that said base drive current results in a current in said collector of said second stage device that is substantially immune to changes in a forward current gain of any device in said multi-stage feedback amplifier, wherein said base drive current is generated in an open loop manner without requiring feedback control based on said collector current of said second stage device.

24. The multi-stage current feedback amplifier of claim 23 wherein said means for providing said base drive current comprises:

means, coupled to said base of said transistor device, for replicating in said replicating means a current through said transistor device;

first mirror means, coupled to said replicating means, for mirroring a current through said replicating device;

second mirror means, coupled to said first mirror means and said second stage device, for mirroring at least a portion of a current through said first mirror means, wherein said base drive current in said base of said second stage device comprises substantially the difference between a current through said second mirror means and said current through said transistor device.

25. The multi-stage current feedback amplifier of claim 23 wherein said means for providing said base drive current comprises:

means, coupled to said base of said transistor device, for replicating in said replicating means a current through said transistor device;

first mirror means, coupled to said replicating means, for mirroring a current through said replicating device;

second mirror means, coupled to said first mirror means and said second stage device, for mirroring at least a portion of a current through said first mirror means, wherein said base drive current in said base of said second stage device substantially equals the difference between a current through said second mirror means and said current through said transistor device.

* * * * *

UNITED STATES PATENT AND TRADEMARK OFFICE
CERTIFICATE OF CORRECTION

PATENT NO. : 5,742,154
DATED : April 21, 1998
INVENTOR(S) : Kolluri

It is certified that error appears in the above-indentified patent and that said Letters Patent is hereby corrected as shown below:

Column 4, line 25, change "IQ11" to --IcQ11--

Column 7, line 64, Change "dose" to --close--

Column 8, line 9, change "dose-loop" to --close-loop--

Column 10, line 10, after "7", insert --wherein--

Column 12, line 25, after "second stage device comprises", delete "substantially"

Signed and Sealed this

Twenty-sixth Day of January, 1999

Attest:

Attesting Officer

*Acting Commissioner of Patents and Trademarks*